US006869852B1

(12) United States Patent
Joseph et al.

(10) Patent No.: US 6,869,852 B1
(45) Date of Patent: Mar. 22, 2005

(54) SELF-ALIGNED RAISED EXTRINSIC BASE BIPOLAR TRANSISTOR STRUCTURE AND METHOD

(75) Inventors: Alvin J. Joseph, Williston, VT (US); Qizhi Liu, Essex Junction, VT (US); BethAnn Rainey, Williston, VT (US); Kathryn T. Schonenberg, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 10/707,756

(22) Filed: Jan. 9, 2004

(51) Int. Cl.[7] ..................... H01L 21/331; H01L 27/082; H01L 27/102; H01L 29/70; H01L 31/11
(52) U.S. Cl. ................. 438/309; 438/320; 438/361; 438/364; 438/359; 257/565; 257/586
(58) Field of Search ................. 438/309, 320, 438/361, 359, 364; 257/565, 586

(56) References Cited

U.S. PATENT DOCUMENTS

| | | | |
|---|---|---|---|
| 5,117,271 A | | 5/1992 | Comfort et al. |
| 5,128,271 A | | 7/1992 | Bronner et al. |
| 5,266,505 A | | 11/1993 | Ahlgren et al. |
| 5,296,391 A | * | 3/1994 | Sato et al. .................. 438/341 |
| 5,494,836 A | | 2/1996 | Imai |
| 5,506,427 A | | 4/1996 | Imai |
| 5,599,723 A | | 2/1997 | Sato |
| 5,824,589 A | * | 10/1998 | Miwa ......................... 438/309 |
| 5,962,880 A | | 10/1999 | Oda et al. |
| 6,080,631 A | | 6/2000 | Kitahata |
| 6,346,453 B1 | | 2/2002 | Kovacic et al. |
| 6,437,376 B1 | | 8/2002 | Ozkan |
| 6,472,262 B2 | * | 10/2002 | Chantre et al. ............. 438/235 |
| 6,509,242 B2 | | 1/2003 | Frei et al. |
| 6,531,369 B1 | | 3/2003 | Ozkan et al. |
| 6,559,020 B1 | | 5/2003 | Salmi |
| 6,617,220 B2 | * | 9/2003 | Dunn et al. ................. 438/309 |
| 6,713,361 B2 | * | 3/2004 | Nawaz et al. ............... 438/309 |
| 2002/0132438 A1 | | 9/2002 | Dunn et al. |
| 2002/0192894 A1 | | 12/2002 | Kalintsky et al. |
| 2003/0057458 A1 | | 3/2003 | Freeman et al. |
| 2003/0064555 A1 | | 4/2003 | Ahlgren et al. |

FOREIGN PATENT DOCUMENTS

JP          2002313798          9/2002

OTHER PUBLICATIONS

"A Selective–Epitaxial–Growth SiGe–Base HBT With SMI Electrodes Feraturing 9.3–ps ECL–Gate Delay," K. Washio et al., IEEE Transactions on Electron Devices, vol. 46, No. 7, Jul. 1999, pp. 1411–1416.

* cited by examiner

*Primary Examiner*—Eddie Lee
*Assistant Examiner*—Samuel A Gebremariam
(74) *Attorney, Agent, or Firm*—Anthony J. Canale; Hoffman, Warnick & D'Alessandro LLC

(57) ABSTRACT

A method of fabricating a bipolar transistor structure that provides unit current gain frequency ($f_T$) and maximum oscillation frequency ($f_{MAX}$) improvements of a raised extrinsic base using non-self-aligned techniques to establish a self-aligned structure. Accordingly, the invention eliminates the complexity and cost of current self-aligned raised extrinsic base processes. The invention forms a raised extrinsic base and an emitter opening over a landing pad, i.e., etch stop layer, then replaces the landing pad with a conductor that is converted, in part, to an insulator. An emitter is then formed in the emitter opening once the insulator is removed from the emitter opening. An unconverted portion of the conductor provides a conductive base link and a remaining portion of the insulator under a spacer isolates the extrinsic base from the emitter while maintaining self-alignment of the emitter to the extrinsic base. The invention also includes the resulting bipolar transistor structure.

14 Claims, 6 Drawing Sheets

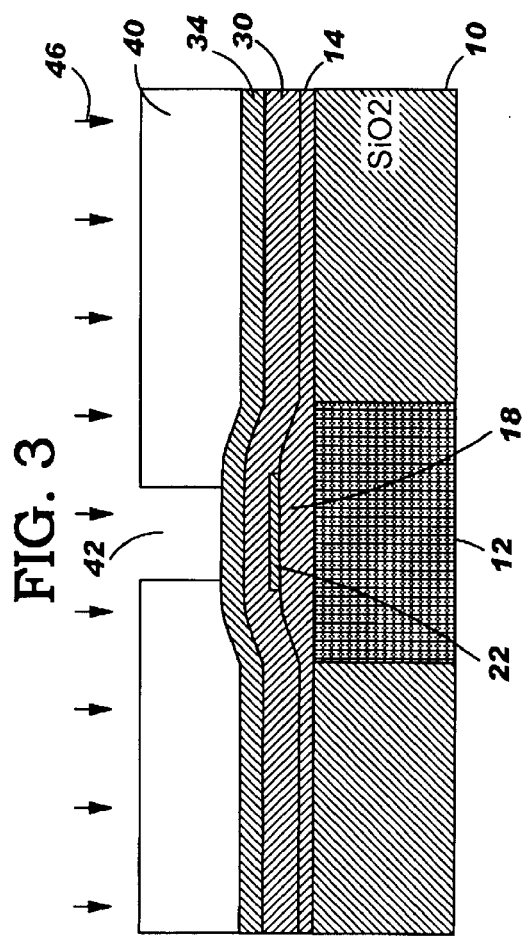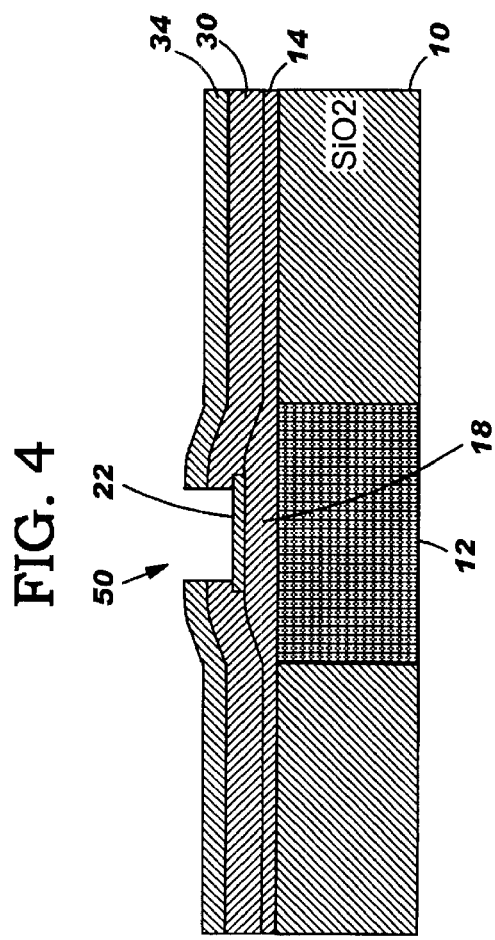

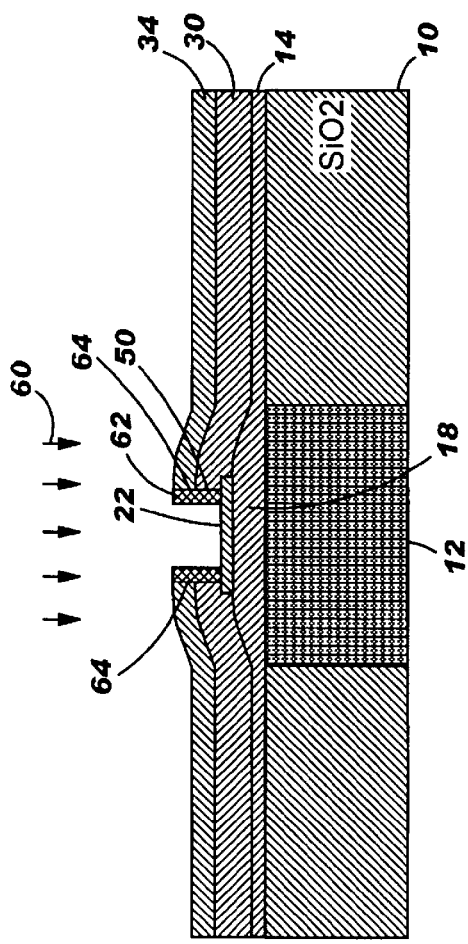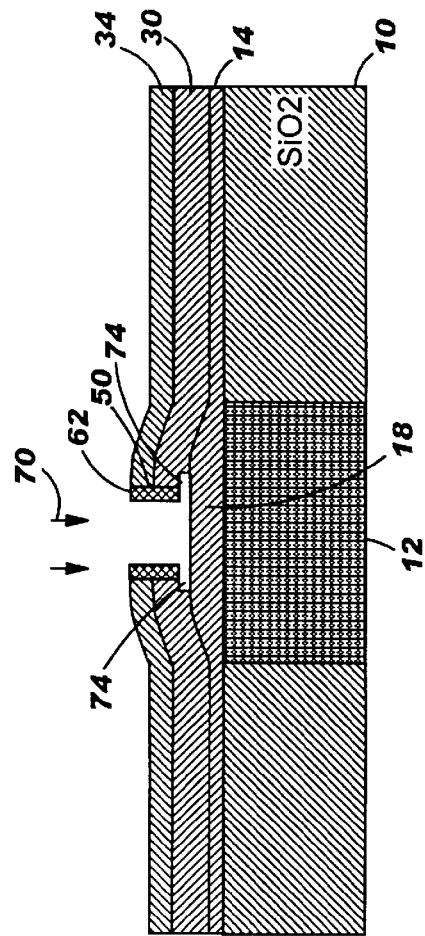

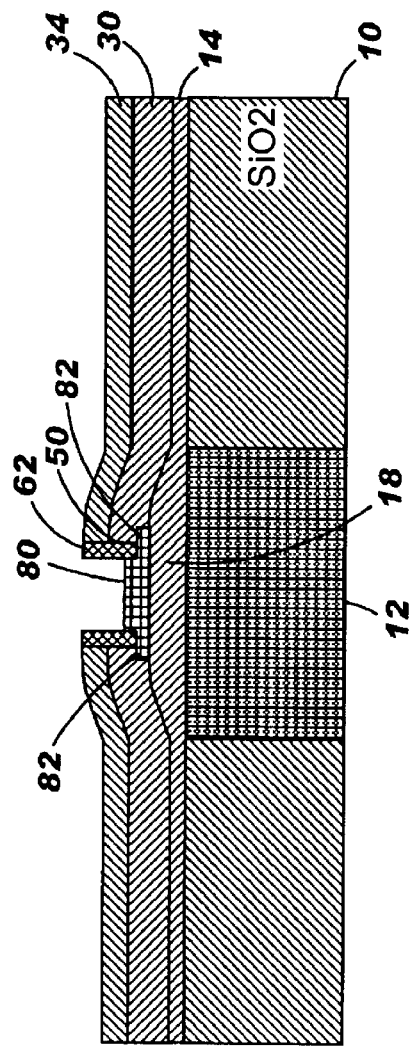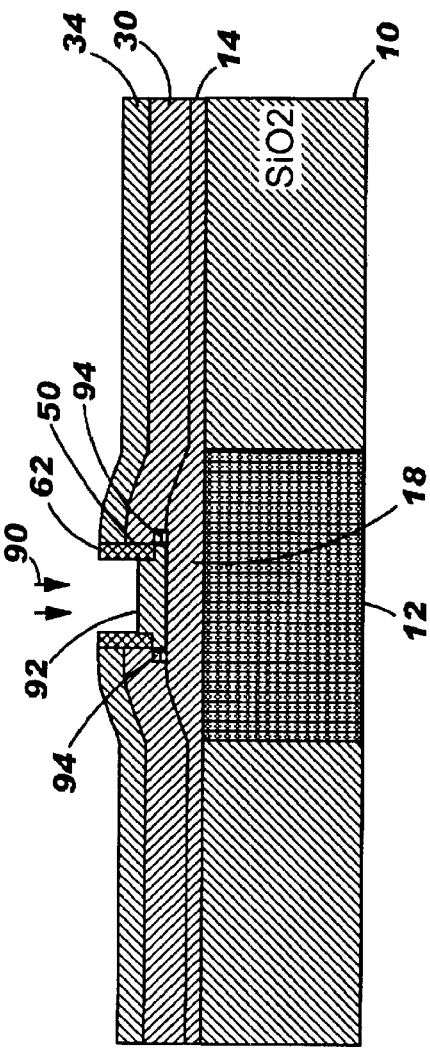

SELF-ALIGNED RAISED EXTRINSIC BASE BIPOLAR TRANSISTOR STRUCTURE AND METHOD

BACKGROUND OF INVENTION

1. Technical Field

The present invention relates generally to bipolar transistors, and more particularly, to a self-aligned raised extrinsic base bipolar transistor structure and method of fabricating the same.

2. Related Art

Self-aligned bipolar transistors with raised extrinsic base are the focus of integrated circuits fabricated for high performance mixed signal applications. Producing bipolar transistors for high speed applications requires improvements to the NPN junction to improve unit current gain frequency ($f_T$) and maximum oscillation frequency ($f_{MAX}$). $f_T$ is inversely proportional to base transit time (tb)(i.e., 1/tb) and collector-base capacitance (Ccb)(i.e., 1/Ccb). One approach to reduce transit time is to eliminate base widening due to thermal enhanced diffusion (TED) effects on the extrinsic base and loss of intrinsic base definition caused by the lateral diffusion of dopants during implantation of the extrinsic base. A deposited, raised extrinsic base eliminates implant damage in the intrinsic base region and therefore does not precipitate base widening during formation. A more important RF design parameter is $f_{MAX}$, which is proportional to $(f_T/(Rb*Ccb))^{0.5}$. $f_{MAX}$ benefits from improved $f_T$ and collector-base capacitance (Ccb), but also requires reducing base resistance (Rb). There are several methods to improve Rb, an important aspect of which is emitter-base alignment. A fully self-aligned raised extrinsic base method will improve $f_T$ and $f_{MAX}$ of a bipolar transistor. Current approaches to achieve these improvements increase process complexity in order to maintain the extrinsic base self-aligned to the emitter, or employ a non-self aligned (NSA) structure in favor of a more simple process.

An approach for self-aligned with raised extrinsic base fabrication is disclosed by Chantre et al. in U.S. Pat. No. 6,472,262 B2. However, the Chantre et al. process results in less lateral control and higher base resistance due to continuous oxide layer 20, which leads to not only increased Rb but also poorer Rb control. Etch selectivity of silicon-germanium to silicon is required.

Another approach is disclosed in Ahlgren in US Publication No. 2003-0064555A1. However, this process is complex.

In view of the foregoing, there is a need in the art for a method of fabricating a self-aligned bipolar transistor structure that does not suffer from the problems of the related art.

SUMMARY OF INVENTION

The invention includes a method of fabricating a bipolar transistor structure that provides $f_T$ and $f_{MAX}$ improvements of a raised extrinsic base using non-self-aligned techniques to establish a self-aligned structure. Accordingly, the invention eliminates the complexity and cost of current self-aligned raised extrinsic base processes. The invention forms a raised extrinsic base and an emitter opening over a landing pad, i.e., etch stop layer, then replaces the landing pad with a conductor that is converted, in part, to an insulator. An emitter is then formed in the emitter opening once the insulator is removed from the emitter opening. An unconverted portion of the conductor provides a conductive base link and a remaining portion of the insulator under a spacer isolates the extrinsic base from the emitter while maintaining self-alignment of the emitter to the extrinsic base. The invention also includes the resulting bipolar transistor structure.

A first aspect of the invention is directed to a method for fabricating a bipolar transistor with a raised extrinsic base, an emitter and a collector, the method comprising the steps of: a) providing an intrinsic base layer; b) forming a first insulator layer on a portion of the intrinsic base layer; c) forming a raised extrinsic base layer on the first insulator layer and the intrinsic base layer; d) forming a second insulator layer on the extrinsic base layer; e) providing an emitter opening by selectively removing portions of the extrinsic base layer and the second insulator layer to expose a portion of the first insulator layer; f) forming a spacer along a sidewall of the emitter opening; g) selectively removing the first insulator layer; h) forming a conductor in a space vacated by the first insulator layer; i) converting the conductor within the emitter opening to a third insulator such that the third insulator extends under at least a portion of the spacer; and j) forming the emitter.

A second aspect of the invention is directed to a self-aligned bipolar transistor structure comprising: an intrinsic base layer; a raised extrinsic base layer in direct contact with the intrinsic base layer; an emitter separated from the raised extrinsic base layer by a spacer and an oxide section under at least a portion of the spacer; and a conductive base link between the oxide section and the raised extrinsic base layer.

A third aspect of the invention is directed to a method for fabricating a bipolar transistor with a raised extrinsic base, an emitter and a collector, the method comprising the steps of: a) providing a landing pad positioned between an intrinsic base layer and an extrinsic base layer; b) providing an emitter opening by selectively removing portions of the extrinsic base layer to expose a portion of the landing pad; c) forming a spacer along a sidewall of the emitter opening; d) selectively removing the landing pad from the emitter opening, under the spacer and under a portion of the extrinsic base layer; e) forming a conductor in a space vacated by the landing pad; f) converting the conductor in the emitter opening and at least a portion under the spacer to an insulator; g) removing the insulator from within the emitter opening; and h) forming the emitter.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein:

FIG. 3 shows a third step of the method.

FIG. 4 shows a fourth step of the method.

FIG. 5 shows a fifth step of the method.

FIG. 6 shows a sixth step of the method.

FIG. 7 shows a seventh step of the method.

FIG. 8 shows an eighth step of the method.

DETAILED DESCRIPTION

Figure 1:
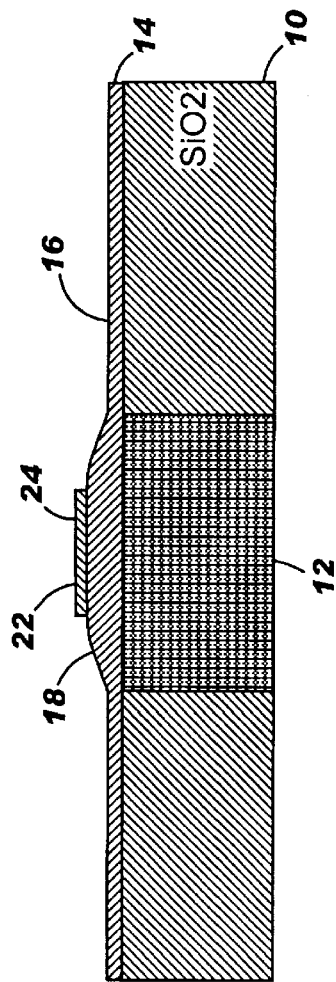
FIG. 1 shows a first step of a method of fabricating a bipolar transistor with a raised extrinsic base.
Figure 10:
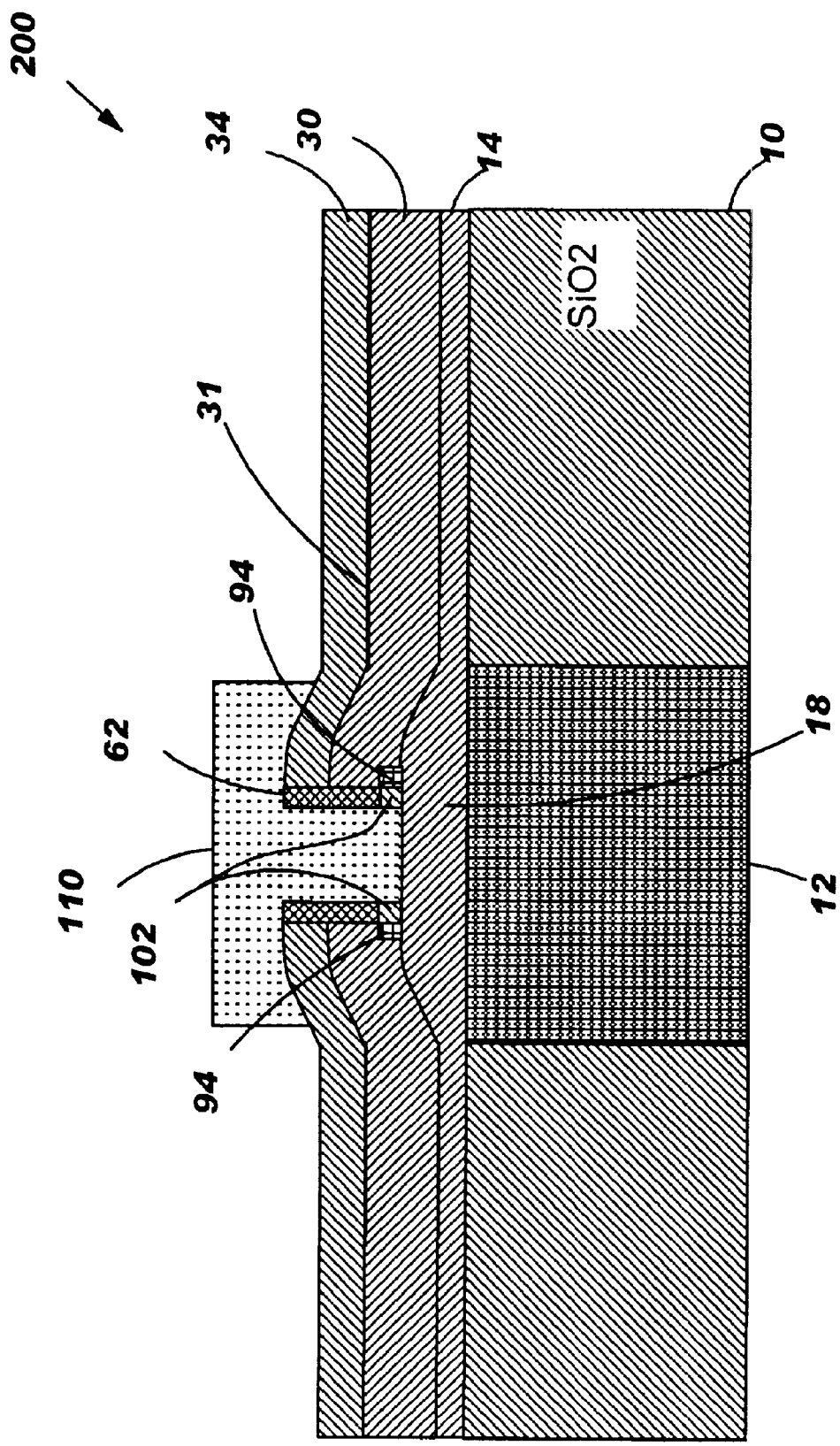
FIG. 10 shows a tenth step of the method and a resulting bipolar transistor.

With reference to the accompanying drawings, FIG. 1 shows a starting point for the processing of the invention. In FIG. 1, a shallow-trench isolation (STI) 10 is provided of silicon dioxide ($SiO_2$)(hereinafter "oxide") having an active silicon (Si) region 12 in a portion thereof. A low temperature epitaxial (LTE) growth of silicon over this structure results in an intrinsic base layer 14 including a polysilicon portion 16 formed over STI 10 and a silicon intrinsic base portion 18 formed over active silicon region 12. Intrinsic base portion 18, as will become apparent below, provides an intrinsic base of a resulting self-aligned bipolar transistor structure 200 (FIG. 10).

A first insulator layer (not shown in its entirety) is then formed over intrinsic base layer 14, patterned and etched to form a landing pad 22, i.e., an etch stop layer, on a portion 24 of intrinsic base portion 18. Landing pad 22 may be formed, for example, by conducting a high temperature oxidation (HTO) or by a high-pressure oxidation (HIPOX) process, and then patterning and etching away the oxide layer. The above noted oxidation processes are meant to be illustrative, and other processes may also be applicable. For example, landing pad 22 may be formed of silicon nitride, or multiple layers of insulator/conductor or insulator/insulator.

Figure 2:
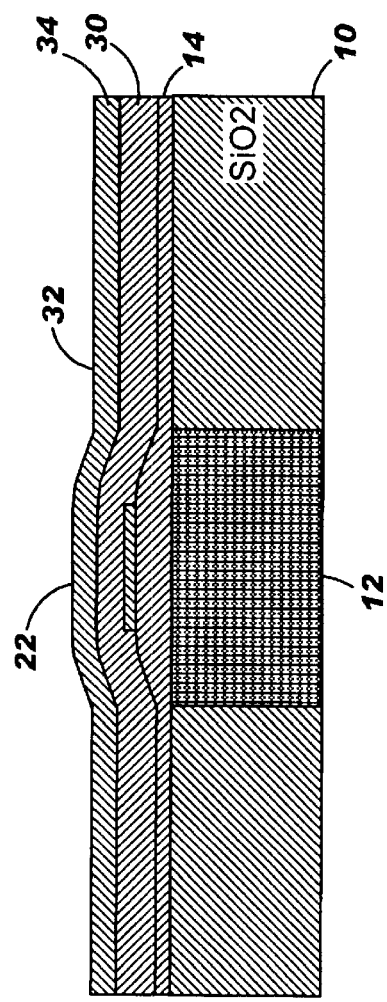
FIG. 2 shows a second step of the method.

FIG. 2 illustrates forming a raised extrinsic base layer 30 on the first insulator layer (i.e., landing pad 22) and intrinsic base layer 14 to provide an extrinsic base 32. Extrinsic base layer 30 may include a polysilicon and/or a single crystal silicon. The polysilicon/silicon may include a dopant such as boron. A second insulator layer 34 such as an oxide layer may then be formed, e.g., by deposition, on extrinsic base layer 30. Second insulator layer 34 may be of any type of deposited oxide or nitride such as high density plasma (HDP) oxide, high-temperature oxide (HTO), TEOS oxide, etc.

FIG. 3 illustrates providing an emitter opening 50 using an emitter window mask layer 40 including an emitter window 42. Mask layer 40 may be any now known or later developed mask. At this point, as shown in FIG. 4, portions of extrinsic base layer 30 and second insulator layer 34 are removed using an etch 46. Etch 46 extends through second insulator layer 34 and extrinsic base layer 30 to expose a portion of the first insulator layer, i.e., landing pad 22. Etch 46 may be, for example, a selective reactive ion etch (RIE).

As shown in FIGS. 5–6, a next step includes selectively removing the first insulator layer, i.e., landing pad 22. If allowed to remain, oxide landing pad 22 under extrinsic base layer 30 results in higher resistance. As shown in FIG. 5, a first part of removing landing pad 22 includes forming an inner silicon nitride (hereinafter "nitride") spacer 62 on a sidewall 64 of emitter opening 50 in a conventional fashion, e.g., by depositing a nitride layer (actual layer not shown) and etching to form spacer 62. Next, as shown in FIG. 6, a wet etch 70 is conducted to selectively remove the first insulator layer, i.e., landing pad 22, from emitter opening 50 and under spacer 62 (openings 74). In addition, a portion under extrinsic base layer 30 is also removed. Wet etch 70 may include, for example, a buffered hydro-fluoric acid (BHF) or diluted HF etch or another conventional wet etch. It should be recognized that spacer 62 may also be constructed after removal of landing pad 22, i.e., the order or processing is not critical.

In FIG. 7, a conductor 80 is formed in a space vacated by landing pad 22, i.e., in emitter opening 50, under spacer 62 and under the portion of extrinsic base layer 30. Conductor 80 may be formed by a low temperature epitaxial (LTE) growth of silicon. As the LTE growth occurs, single crystal silicon re-grows in emitter opening 50 and within openings 74 under spacer 62 and the portion of extrinsic base layer 30 where landing pad 22 existed. As a result, conductor 80 forms a conductive base link 82 between extrinsic base layer 30 and intrinsic base layer 14, and in particular, intrinsic base portion 18. In contrast to landing pad 22, base link 82 provides a direct link between extrinsic base layer 30 and intrinsic base portion 18.

Next, as shown in FIG. 8, an oxidation 90 is conducted such as high pressure oxidation (HIPOX) 90 into emitter opening 50 to form an oxide portion 92 from conductor 80 (FIG. 7) within emitter opening 50 and from any conductor (not shown) formed on spacer 62 sidewalls and second insulator layer 34. Where a conductor is formed on spacer 62 sidewalls and second insulator layer 34, oxidation 90 may form a continuous layer, which is later removed as will be discussed below. The amount of oxidation determines how far into conductor 80 the oxide portion 92 is formed, and as will be more apparent below, the sparing between extrinsic base layer 30 and emitter 110 (FIG. 10). As illustrated in FIG. 8, oxide portion 92 separates base link 94 from emitter opening 50. In one embodiment, oxide portion 92 exists within emitter opening 50 and under at least a portion of spacer 62. Depending on the amount of oxidation provided, oxide portion 92 may also extend under a portion of extrinsic base layer 30. However, it is preferable, that oxide portion 92 be present only under spacer 62 to reduce the link resistance between extrinsic base layer 30 and intrinsic base layer 14, 18.

Figure 9:
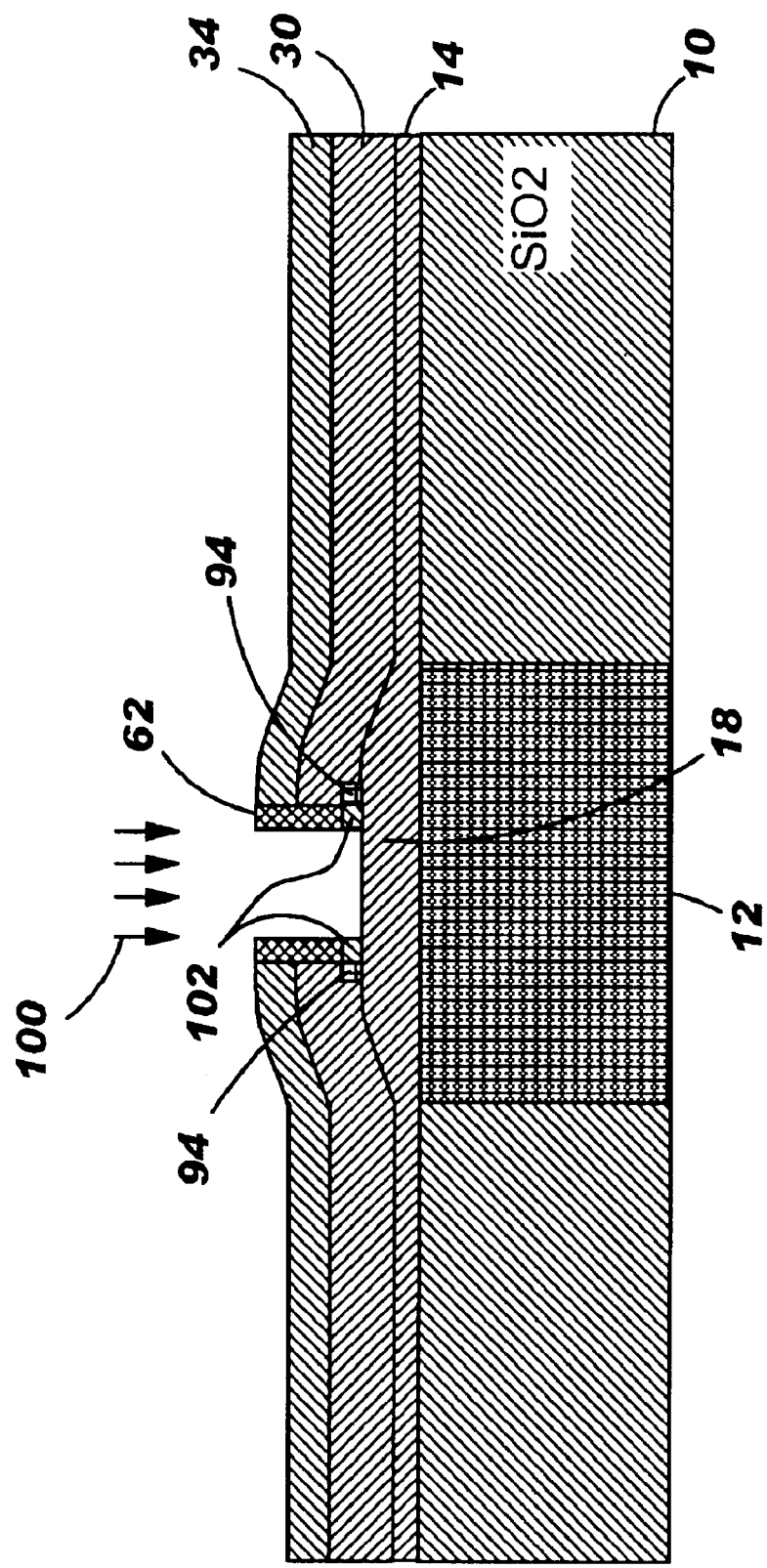
FIG. 9 shows a ninth step of the method.

Next, as shown in FIG. 9, an etch 100 to remove oxide portion 92 within emitter opening 50 is conducted. Etch 100 may also remove any oxide from spacer 62 sidewalls and atop second insulator layer 34 if present. Etch 100 can be, for example, a chemical-oxide remove (COR) etch, reactive ion etch (RIE) or a dilute hydrofluoric acid (DHF) etch. The former includes reacting oxide portion 92 to form a reaction product, as described in U.S. Pat. No. 5,282,925, which is hereby incorporated by reference. In one embodiment, oxide portion 92 is reacted by exposure to a vapor phase etch comprising hydrogen fluoride and ammonia gas. In another embodiment, the vapor phase etch may comprise ammonia bifluoride. The conditions and concentrations of material may vary according to specific applications. The reaction product includes etched oxide and reactants and combinations thereof. Removal of the reaction product may be accomplished by: evaporating the reaction product from the surface, for example, by heating the substrate, or by rinsing the surface with water ($H_2O$).

As shown in FIG. 9, as a result of the above-described etch, oxide portion 92 is removed within emitter opening 50. Note, however, a remaining portion 102 of oxide portion 92 remains below at least a portion of spacer 62 and, possibly, a portion of extrinsic base layer 30 depending on the amount of oxidation. Remaining portion 102 provides insulation between extrinsic base layer 30 and a to-be-formed emitter. In addition, the size of remaining portion 102 defines a spacing between emitter 110 (FIG. 10) formed in the emitter opening and base link 82 and/or extrinsic base layer 30.

Finally, as shown in FIG. 10, a polysilicon layer is deposited, patterned and etched to form emitter 110 within the emitter opening. It should be recognized that as a polysilicon layer is deposited, it may be re-aligned, i.e., some portion is converted to a monocrystalline silicon. Other processing to finalize transistor 200 may be conducted according to any now known or later developed manner. Transistor 200 includes an intrinsic base layer 14, 18; a raised extrinsic base layer 30 in direct contact with intrinsic base layer 14, 18; an emitter 10 separated from raised extrinsic base layer 30 by spacer 62 and oxide section 102 (of converted conductor) under spacer 62; and a conductive base link 94 between oxide section 102 and raised extrinsic base layer 30. In addition, raised extrinsic base layer 30 is non-planar.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method for fabricating a bipolar transistor with a raised extrinsic base, an emitter and a collector, the method comprising the steps of:

a) providing an intrinsic base layer;

b) forming a first insulator layer on a portion of the intrinsic base layer;

c) forming a raised extrinsic base layer on the first insulator layer and the intrinsic base layer;

d) forming a second insulator layer on the raised extrinsic base layer;

e) providing an emitter opening by selectively removing portions of the raised extrinsic base layer and the second insulator layer to expose a portion of the first insulator layer;

f) forming a spacer along a sidewall of the emitter opening;

g) selectively removing the first insulator layer;

h) forming a conductor in a space vacated by the first insulator layer;

i) converting the conductor within the emitter opening to a third insulator such that the third insulator extends under at least a portion of the spacer; and j) forming the emitter.

2. The method of claim 1, wherein the selectively removing step includes etching to remove the first insulator layer from the emitter opening, under the spacer and under a portion of the raised extrinsic base layer.

3. The method of claim 2, further comprising the step of removing the third insulator within the emitter opening to the intrinsic base layer, leaving a remaining portion of the third insulator under the at least a portion of the spacer.

4. The method of claim 1, wherein the raised extrinsic base layer is non-planar.

5. The method of claim 1, wherein the raised extrinsic base layer comprises one of: a polysilicon and single crystalline silicon.

6. The method of claim 1, wherein the conductor comprises single crystalline silicon.

7. The method of claim 1, wherein the emitter forming step includes depositing, patterning and etching a polysilicon.

8. A method for fabricating a bipolar transistor with a raised extrinsic base, an emitter and a collector, the method comprising the steps of:

a) providing a landing pad positioned between an intrinsic base layer and an extrinsic base layer;

b) providing an emitter opening by selectively removing portions of the extrinsic base layer to expose a portion of the landing pad;

c) forming a spacer along a sidewall of the emitter opening;

d) selectively removing the landing pad from the emitter opening, under the spacer and under a portion of the extrinsic base layer;

e) forming a conductor in a space vacated by the landing pad;

f) converting the conductor in the emitter opening and at least a portion under the spacer to an insulator;

g) removing the insulator from within the emitter opening; and h) forming the emitter.

9. The method of claim 8, wherein the converting step includes oxidizing the conductor to form an oxide insulator within the emitter opening such that the oxide insulator extends under at least a portion of the spacer but not into the extrinsic base layer.

10. The method of claim 8, wherein the emitter forming step includes depositing, patterning and etching a polysilicon.

11. The method of claim 8, wherein a width of a remaining portion of the insulator defines a spacing between the emitter and the raised extrinsic base.

12. The method of claim 8, wherein the extrinsic base layer is non-planar.

13. The method of claim 8, wherein the raised extrinsic base layer comprises one of: a polysilicon and single crystalline silicon.

14. The method of claim 8, wherein the conductor comprises single crystalline silicon.

* * * * *